United States Patent
Prams

(10) Patent No.: US 12,504,457 B2
(45) Date of Patent: Dec. 23, 2025

(54) CIRCUIT DEVICE FOR A VEHICLE, AND METHOD FOR OPERATING A CIRCUIT DEVICE

(71) Applicant: Knorr-Bremse Systeme Fuer Nutzfahrzeuge GmbH, Munich (DE)

(72) Inventor: Stefan Prams, Unterschleissheim (DE)

(73) Assignee: KNORR-BREMSE SYSTEME FUER NUTZFAHRZEUGE GMBH, Munich (DE)

(*) Notice: Subject to any disclaimer, the term of this patent is extended or adjusted under 35 U.S.C. 154(b) by 166 days.

(21) Appl. No.: 17/312,804

(22) PCT Filed: Dec. 11, 2019

(86) PCT No.: PCT/EP2019/084706
§ 371 (c)(1),
(2) Date: Jun. 10, 2021

(87) PCT Pub. No.: WO2020/126758
PCT Pub. Date: Jun. 25, 2020

(65) Prior Publication Data
US 2022/0113341 A1    Apr. 14, 2022

(30) Foreign Application Priority Data

Dec. 19, 2018   (DE) .................... 10 2018 132 775.7

(51) Int. Cl.
*G01R 31/00* (2006.01)
*G01R 31/52* (2020.01)
*H05K 1/18* (2006.01)

(52) U.S. Cl.
CPC ........... *G01R 31/006* (2013.01); *G01R 31/52* (2020.01); *H05K 1/18* (2013.01); *H05K 2201/10151* (2013.01)

(58) Field of Classification Search
CPC ........ G01R 31/006; G01R 31/52; H05K 1/18; H05K 2201/10151
See application file for complete search history.

(56) References Cited

U.S. PATENT DOCUMENTS

| | | | |
|---|---|---|---|
| 6,011,398 A * | 1/2000 | Bald | G01R 31/52 324/508 |
| 6,262,585 B1 * | 7/2001 | Frodsham | G01R 31/31715 327/543 |

(Continued)

FOREIGN PATENT DOCUMENTS

| | | | |
|---|---|---|---|
| AU | 2010257372 B2 * | 8/2013 | ............ B60L 3/0069 |
| DE | 60019343 T2 | 3/2006 | |

(Continued)

OTHER PUBLICATIONS

International Search Report for PCT/EP2019/084706 issued Mar. 16, 2020.

*Primary Examiner* — Lee E Rodak
*Assistant Examiner* — Demetrius R Pretlow
(74) *Attorney, Agent, or Firm* — NORTON ROSE FULBRIGHT US LLP

(57) ABSTRACT

A circuit device for a vehicle, including: a printed circuit board having an operating circuit for operating a unit, a first conductor track for connecting the operating circuit to the unit, and a second conductor track for connecting the operating circuit to the unit; a detection electrode for detecting a leakage current affecting at least one of the conductor tracks; and a detection arrangement to use a signal applied to the detection electrode to provide a detection signal representing the leakage current. Also described are a related method.

23 Claims, 4 Drawing Sheets

(56) References Cited

U.S. PATENT DOCUMENTS

| | | | |
|---|---|---|---|
| 7,154,278 B2* | 12/2006 | Scholl | G01R 31/52 324/510 |
| 2006/0114000 A1* | 6/2006 | Scholl | G01R 31/52 324/522 |
| 2006/0281338 A1* | 12/2006 | Chanda | H01L 22/14 438/791 |
| 2007/0053119 A1* | 3/2007 | Goto | H01H 83/02 361/42 |
| 2007/0109006 A1* | 5/2007 | Klass | G01R 31/52 324/762.02 |
| 2007/0159741 A1* | 7/2007 | Breitling | B60R 16/0232 361/42 |
| 2008/0209285 A1* | 8/2008 | Acharyya | G01R 31/318575 714/724 |
| 2009/0301801 A1* | 12/2009 | Fujitake | B60L 53/22 903/907 |
| 2010/0156426 A1* | 6/2010 | Kang | G01R 31/52 324/444 |
| 2010/0257492 A1* | 10/2010 | Joshi | G11C 29/028 716/100 |
| 2012/0212245 A1* | 8/2012 | Pinto | H01L 22/34 257/E23.002 |
| 2013/0301168 A1* | 11/2013 | Ploix | B60L 3/00 361/42 |
| 2014/0043058 A1* | 2/2014 | Onishi | G01R 31/52 324/762.01 |
| 2015/0022153 A1* | 1/2015 | Bouchez | B60L 53/00 320/109 |
| 2015/0233996 A1* | 8/2015 | Yoon | G01R 31/52 324/509 |
| 2016/0003887 A1* | 1/2016 | Nagase | G01R 31/1263 327/546 |
| 2016/0154047 A1* | 6/2016 | Alcouffe | G01R 31/52 324/538 |
| 2016/0221444 A1* | 8/2016 | Ben Ahmed | B60L 58/10 |
| 2016/0233789 A1* | 8/2016 | Onishi | H03K 17/08128 |
| 2016/0266200 A1* | 9/2016 | Mikalo | G01R 31/52 |
| 2017/0063075 A1* | 3/2017 | Takeuchi | H02H 3/16 |
| 2017/0328933 A1* | 11/2017 | Mori | G01R 31/52 |
| 2018/0226816 A1* | 8/2018 | Na | H02H 7/18 |
| 2019/0006020 A1* | 1/2019 | Sundaresan | G11C 29/12005 |
| 2019/0094284 A1* | 3/2019 | Takada | G06G 7/186 |
| 2019/0305772 A1* | 10/2019 | Kawata | H03K 17/687 |
| 2020/0225280 A1* | 7/2020 | Farris | H01H 47/002 |
| 2020/0233039 A1* | 7/2020 | Jorgensen | H03F 3/181 |
| 2020/0393509 A1* | 12/2020 | Kim | G01R 31/319 |
| 2021/0048483 A1* | 2/2021 | Zheng | G01R 31/56 |
| 2022/0011378 A1* | 1/2022 | Li | G01R 31/54 |

FOREIGN PATENT DOCUMENTS

| | | | | |
|---|---|---|---|---|
| DE | 102005033135 A1 | | 1/2007 | |
| DE | 102005046282 A1 | | 3/2007 | |
| DE | 102008052467 A1 | | 4/2010 | |
| DE | 102015015089 A1 | * | 5/2017 | ......... B25J 19/0079 |
| GB | 2314699 A | | 1/1998 | |
| JP | 2009168643 A | * | 7/2009 | |
| WO | 9901774 A1 | | 1/1999 | |

\* cited by examiner

CIRCUIT DEVICE FOR A VEHICLE, AND METHOD FOR OPERATING A CIRCUIT DEVICE

FIELD OF THE INVENTION

The present approach relates to a circuit device for a vehicle and to a method for operating a circuit device.

BACKGROUND INFORMATION

Patent document DE 600 19 343 T2 discusses an electrical cable having a ground plane layer of a conductive polymeric material and a lead-off conductor for detecting a ground fault.

SUMMARY OF THE INVENTION

An object of the present approach, against this background, is to create an improved circuit device for a vehicle, and a method for operating a circuit device.

This object may be achieved by a circuit device for a vehicle and by a method for operating a circuit device, according to the main descriptions herein.

The advantages that can be achieved with the approach presented are that a diagnostic method for the detection of unwanted current paths, for example in sensors, can be realized.

A circuit device for a vehicle has the following features:

a printed circuit board having an operating circuit for operating a unit, and having a first conductor track for connecting the operating circuit to the unit, and a having second conductor track for connecting the operating circuit to the unit;

a detection electrode for detecting a affecting at least one of the conductor tracks; and a detection arrangement (structure/device) configured to use a signal applied to the detection electrode in order to provide a detection signal representing the leakage current.

The vehicle may be, for example, a commercial vehicle, for example a truck or a rail vehicle. The circuit device may be part of a system of the vehicle, for example part of a braking system, a steering system or an assistance system. The unit to be operated may be, for example, a sensor, an actuator or a logic circuit. The operating circuit may be configured to provide a control signal or an operating signal to the unit via at least one of the conductor tracks, and additionally or alternatively to receive a data signal from the unit. Operating the unit may thus be understood as both the provision of necessary signals to the unit and the receiving and, if necessary, evaluation of signals provided by the unit. The operating circuit may be arranged on the printed circuit board as an integrated circuit or in the form of a plurality of components interconnected to form an electric circuit. The conductor tracks may be routed on a top side or inside the printed circuit board. The conductor tracks may provide a direct connection between the operating circuit and the unit, or lead to a connector via which the unit can be contacted. At least one of the conductor tracks may thus also comprise a portion that is part of a connector, for example a contact surface of the connector, a contact of the connector or an electrical conductor of the connector, such as, for example, a contact pin or a contact socket. The detection electrode may be formed on the printed circuit board, for example in the form of a conductor track or a contact surface, or may be arranged on the conductor track. The detection electrode may be electrically isolated from the conductor tracks. The detection electrode may be arranged between the conductor tracks or between further lines or contacts that are connected to the conductor tracks. A leakage current may be understood as an unwanted current flow to or from one of the conductor tracks. For example, it may be understood to be a current flow between the first conductor track and the second conductor track and/or between one of the conductor tracks and a further electrical line or electrical potential surface of the printed circuit board. The detection arrangement may be configured to evaluate a value and/or a profile of the signal applied to the detection electrode, in order to provide the detection signal. For example, the detection arrangement may be configured to evaluate a voltage value, a current value and/or a time profile of the signal applied to the detection electrode, in order to provide the detection signal. The circuit device may comprise the unit.

The unit may be realized as a sensor. Accordingly, the operating circuit may be configured to operate the unit realized as a sensor. The sensor may be based, for example, on an inductive, a capacitive or a magnetic measuring principle. Thus, the described approach may be used advantageously in conjunction with a sensor system. In particular, this may be a safety-relevant sensor system. Sensors whose signals are influenced by parasitic currents are widely used. The approach described may additionally or alternatively be used with passive insulating approaches. Advantageously, the approach presented here does not require complex geometries in order to increase creepage distances. Sealed connectors or lacquered connection points, for example on printed circuit boards, can also be dispensed with. Thus, no significant input for insulation or the like is required. Advantageously, the effectiveness, especially the long-term effectiveness, is easily quantifiable. Service-life tests and complex test procedures can therefore be dispensed with. Instead, a regular evaluation of the detection signal is sufficient. The approach described can advantageously be used in conjunction with a new state of the art being introduced in the field of functional safety, which increasingly relies on solutions that can be quantified "in their effect" to demonstrate the protection of safety-critical electronics.

The operating circuit may be configured to read-in, via at least one of the conductor tracks, a data signal provided by the unit. Advantageously, a leakage current affecting the integrity of the data signal can be reliably detected by use of the detection electrode.

For example, the operating circuit may be configured to read-in, via at least one of the conductor tracks, an error signal provided by the unit. Such an error signal may be a so-called "Plausible but Wrong" signal, which may indicate that data provided by the unit is plausible but wrong. The detection of a leakage current affecting such an error signal is important to enable the circuit device to be operated safely.

The operating circuit and the unit may form a high-frequency resonant circuit. For example, the operating circuit may be realized as an oscillator circuit in order to operate a unit realized as a coil. Thus, the operating circuit and the coil may form an oscillating circuit. An oscillation frequency of the resonant circuit in this case may be adapted to a functionality of the coil that is to be provided. A corresponding coil may be used, for example, as a sensor for detecting an event influencing a magnetic field of the coil.

The circuit device may comprise a connector for connecting the unit to the printed circuit board. The connector may have a first contact for contacting a first terminal of the unit, a second contact for contacting a second terminal of the unit, and a third contact arranged between the first contact and the second contact. The first contact may be connected to the first conductor track, the second contact may be connected to the second conductor track, and the third contact may be connected to the detection electrode or realized as the detection electrode. A connector is suitable for electrically contacting a unit external to the printed circuit board or mounted on the printed circuit board. Arrangement of the detection electrode in the region of the connector enables a component susceptible to leakage currents to be monitored.

The detection arrangement may be configured to use the detection signal in order to provide a correction signal for correcting a signal transmitted via the first conductor track and/or the second conductor track. In this way, an effect of a detected leakage current on a transmitted signal can be corrected or compensated. In this way, the circuit device can continue to operate despite leakage current.

The detection arrangement may be configured to use the detection signal in order to provide a switch-off signal for switching off the unit. In this way, the unit can be taken out of operation, for example, when the leakage current reaches a critical value.

The detection arrangement may be configured to use the detection signal in order to provide a change-over signal for changing over a system comprising the circuit device to a safe state. In this way, the leakage current can be prevented from leading to an uncontrolled state of the system.

The detection arrangement may be configured to use the detection signal in order to provide a or a warning signal. The warning signal may be used by a monitoring arrangement, or used to control a display device, for example to warn a driver of the vehicle.

The detection arrangement may be configured to determine a time profile of the signal applied to the detection electrode. Further, the detection arrangement may be configured to use the time profile to provide the detection signal. In this way, the detection signal may be provided, for example, if the leakage current increases strongly within a short time interval, such that an imminent failure of the circuit device is to be expected.

The detection arrangement may be configured to use the signal applied to the detection electrode in order to determine an electrical resistance value between the first conductor track and the second conductor track. Further, the detection arrangement may be configured to use the resistance value in order to determine the detection signal. The resistance value may be considered to be reliable indicator of the leakage current.

According to an embodiment, the circuit device may have a movable plunger. The operating circuit may be configured to use an operating signal, transmitted via the first conductor track and the second conductor track, in order to provide a position signal representing a position of the movable plunger. Use of the detection electrode allows detection of a leakage current that would result in a falsification of the operating signal, and thus in a falsification of the position signal. The operating signal may be an alternating signal provided by an oscillator circuit, for example an alternating voltage.

A method for operating a said circuit device comprises the following steps:

transmitting an operating signal via the first conductor track and the second conductor track; and evaluating the signal applied to the detection electrode, in order to detect the leakage current.

This method may be realized, for example, in software or hardware, or in a mixed form of software and hardware, for example in a control device.

Exemplary embodiments of the approach presented here are explained in greater detail in the following description with reference to the figures.

In the following description of favorable exemplary embodiments of the present approach, elements of similar effect that are represented in the various figures are denoted by the same or similar references, and description of these elements is not repeated.

DETAILED DESCRIPTION

Figure 1:
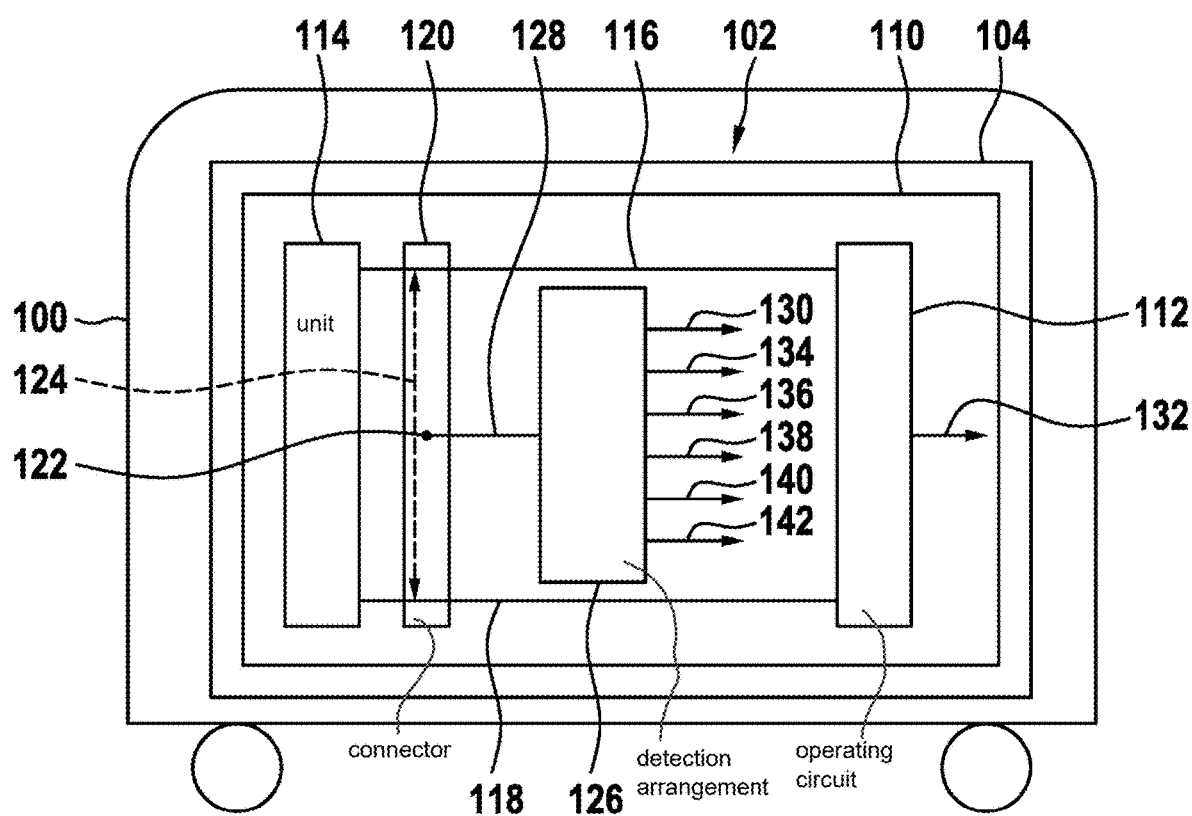
FIG. 1 shows a schematic representation of a vehicle having a circuit device according to an exemplary embodiment.

FIG. 1 shows a schematic representation of a vehicle 100 having a circuit device 102 according to an exemplary embodiment. As an example, the circuit device 102 is part of a system 104 of the vehicle 100, for example a braking system.

The circuit device 102 comprises a printed circuit board 110, on which comprises an operating circuit 112 for operating a unit 114. The unit 114 may be part of the circuit device 102 or part of the system 104. The unit 114 may be external to the printed circuit board 110 or mounted on the printed circuit board.

A first terminal of the operating circuit 112 is connected to a first terminal of the unit 114 via a first conductor track 116. Accordingly, a second terminal of the operating circuit 112 is connected to a second terminal of the unit 114 via a second conductor track 118.

According to an exemplary embodiment, the conductor tracks 116, 118 directly connect the operating circuit 112 to the unit 114. According to an alternative exemplary embodiment, the printed circuit board 110 has a connector 120. In this case, the first conductor track 116 connects the first terminal of the operating circuit 112 to a first contact of the connector 120, and the second conductor track 118 connects the second terminal of the operating circuit 112 to a second contact of the connector 120. In this case, the first terminal of the unit 114 is connected to the first contact of the connector 120 via a first line, and the second terminal of the unit 114 is connected to the second contact of the connector 120 via a second line, for example by use of a mating connector that can be coupled to the connector 120. The contacts of the connector 120 are realized, for example, as connector pins or connector sockets.

The circuit device 102 comprises a detection electrode 122 for detecting a leakage current 124 affecting at least one of the conductor tracks 116, 118. For example, such a leakage current originates from and/or leads into one of the conductor tracks 116, 118. It may therefore be an unwanted flow of current between the first conductor track 116 and the second conductor track 118, or an unwanted flow of current between one of the conductor tracks 116, 118 and, for example, another conductor track or another potential surface. According to various exemplary embodiments, the detection electrode 122 is realized as a conductor track of the printed circuit board 110, as a contact surface of the printed circuit board 110 or as part of the connector 120, for example as a third contact of the connector 120. In order to be able to detect the leakage current 124, the detection electrode 122 is arranged at a suitable position between or at least adjacent to the conductor tracks 116, 118, or at least one of the conductor tracks 116, 118.

The circuit device 102 has a detection arrangement 126. According to this exemplary embodiment, the detection arrangement 126 is arranged on the printed circuit board 110. According to an alternative exemplary embodiment, the one detection arrangement 126 is arranged externally to the printed circuit board 110. According to this exemplary embodiment, the detection arrangement 126 is connected to the detection electrode 122 via a third conductor track 128 of the printed circuit board 110. Alternatively, the conductor track 128 forms the detection electrode 122. The detection arrangement 126 is configured to use a signal applied to the detection electrode 122 in order to provide a detection signal 130 representing the leakage current 124. For this purpose, for example, the detection arrangement 126 is configured to measure a current value of an electrical current flowing across the third conductor track 128, or a voltage value of an electrical voltage applied to the detection electrode 122, and to use it to determine a magnitude of the leakage current 124. According to an exemplary embodiment, the detection arrangement 126 is configured to measure a first potential difference between the detection electrode 122 and the first conductor track 116, and a second potential difference between the detection electrode 122 and the second conductor track 118, and to use these to determine a magnitude of the leakage current 124. According to an exemplary embodiment, the detection arrangement 126 is configured to determine a resistance value of an electrical resistance between the first conductor track and the second conductor track, and to determine the detection signal 130 using the resistance value. According to an exemplary embodiment, the detection arrangement 126 is configured to use at least one of a reference value or threshold value, a look-up table, and/or an assignment rule to determine the detection signal 130.

The unit 114 is realized, for example, as a sensor or an actuator or as an electrical circuit. The operating circuit 112 is configured to provide at least one signal, for example an operating signal, via the conductor tracks 116, 118, which enables operation of the unit 114, and/or to process at least one signal that is provided by the unit 114. In each case, this may be an analogue or digital signal. An operating current or an operating voltage, a data signal, an error signal, or any other signal required to operate the unit 114 or provided by the unit 114 during operation of the unit 114, may be transmitted via at least one of the conductor tracks 116, 118.

According to an exemplary embodiment, the unit 114 is realized as a sensor, for example as an inductive sensor, a capacitive sensor or a sensor having another operating principle. Accordingly, the operating circuit 112 is configured to provide a signal required to operate the sensor and/or to receive a signal provided or modified by the sensor, and to evaluate it, for example, in order to obtain a measurement result.

According to an exemplary embodiment, the unit 114 is realized as a coil, and the operating circuit 112 constitutes an oscillator circuit for providing an operating signal, for example an AC signal or AC voltage signal, suitable for exciting the coil, to the conductor tracks 116, 118. In this case, the operating circuit 112 and the unit 114 form a resonant circuit.

The operating circuit 112 is configured, for example, to detect and evaluate, from a profile of the operating signal, an influence of a magnetic field generated by the unit 114. The magnetic field is influenced, for example, by a position or movement of a plunger. According to an exemplary embodiment, the operating circuit is configured to use the operating signal applied to the conductor tracks 116, 118 to determine a position of such a movable plunger, and to provide a position signal 132 representing the position.

According to an exemplary embodiment, when the leakage current 124 occurs, this results in a change in a signal transmitted via at least one of the conductor tracks 116, 118.

According to an exemplary embodiment, the detection arrangement 126 is configured to use the detection signal 130 to provide a correction signal 134 that is used, for example, by the operating circuit 112 to correct a signal transmitted via at least one of the conductor tracks 116, 118. The correction signal 134 may be output by the detection arrangement 126 in addition or as an alternative to the detection signal 130. Additionally or alternatively, the detection arrangement 126 is configured to use the detection signal 130 to provide a switch-off signal 136, for example to an interface to the unit 114 or the operating circuit 112, for switching off the unit 114. Additionally or alternatively, the detection arrangement 126 is configured to use the detection signal 130 to provide a change-over signal 138 suitable for changing over the operating circuit 112 or the system 114 to a safe state. Additionally or alternatively, the detection arrangement 126 is configured to use the detection signal 130 to provide a warning signal 140. The warning signal 140 is used, for example, to activate a warning light that is visible to a driver of the vehicle 100.

According to an exemplary embodiment, the detection arrangement 126 is configured to determine a time profile of the signal applied to the detection electrode 122, and to use the time profile to provide the detection signal 130. For example, the detection arrangement 126 is configured to provide the detection signal 130 if the time course of the signal applied to the detection electrode 122 has a predetermined profile characteristic. Additionally or alternatively, the detection arrangement 126 is configured to provide, as a profile signal 142, the time profile of the signal applied to the detection electrode 122. This makes it possible, for example, to evaluate the time profile of the leakage current 124.

Figure 2:
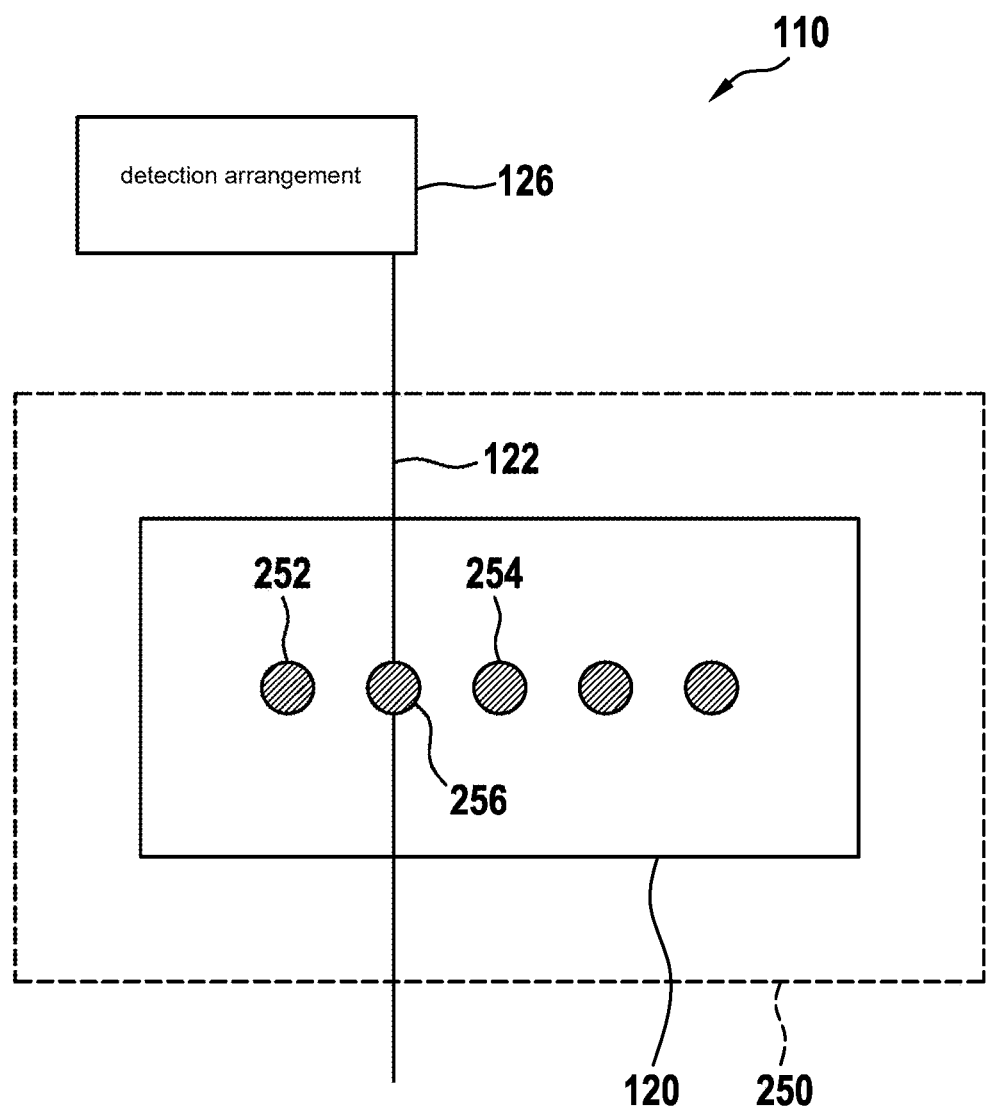
FIG. 2 shows a schematic representation of a portion of a printed circuit board of a circuit device according to an exemplary embodiment.

FIG. 2 shows a schematic representation of a portion of a printed circuit board 110 of a circuit device 102 according to an exemplary embodiment. The printed circuit board 110 may be an exemplary embodiment of the printed circuit board described in FIG. 1.

The printed circuit board 110 has an lacquered surface. A rectangular portion of the surface of the printed circuit board 110 in which a connector 120 is arranged is excluded from the lacquering. In FIG. 2, a boundary 250 of the region protected by the lacquer is marked, there being no lacquer inside the region enclosed by the boundary 250.

The connector 120 has at least a first contact 252, a second contact 254 and a third contact 256. The third contact 256 in this case is arranged between the first contact 252 and the second contact 254. The contacts 252, 254, 256 are arranged in a row. As an example, the connector 120 has two more contacts. As an example, the contacts 252, 254, 256 of the connector 120 are realized as pins.

According to this exemplary embodiment, the detection electrode 122 is realized as a conductor track that is connected in an electrically conductive manner to the third contact 256. Thus, the detection arrangement 126 is connected to the third contact 256 via the detection electrode 122. As an example, the detection electrode 122 is realized as a conductor track that extends in a straight line through the non-lacquered portion surrounded by the boundary 250.

The detection electrode 122 is also referred to as a monitoring electrode, which is monitored by the detection arrangement 126. The detection arrangement 126 is also referred to as logic circuitry or monitoring logic circuitry, and is realized, for example, as a microcontroller or as an algorithm realized in hardware or software. According to an exemplary embodiment, a sensitivity of the detection arrangement 126 is adjustable. For example, the functionality of the detection arrangement 126 is realized in a control device.

By use of the detection electrode 122 and the detection arrangement 126, the formation of unwanted current paths can be actively detected, in contrast to passive protective mechanisms. For this purpose, the detection electrode 122 is attached and its electrical state is monitored by logic circuitry, in this case the detection arrangement 126. This is effected in the spatial vicinity of points for which the formation of a current path, i.e. the lowering of the resistance between the points, is unfavorable and/or undesirable. For example, the points are the contacts 252, 254.

According to an exemplary embodiment, the contacts 252, 254 are used to contact terminals of a unit as described with reference to FIG. 1. In the following, it is assumed that the unit is a sensor.

The arrangement composed of the detection electrode 122 and detection arrangement 126 is realized in such a manner that the mechanism is demonstrably able to detect the emergence of parasitic, i.e. unwanted current paths that are detrimental to operation.

The benefit consists in the detection of a developing influence before it comes to a safety-relevant impairment of the currents connected with the operation of the sensor, or within a time frame that enables compliance with the process safety time. This results in the following possibility of a system reaction toward a safe state.

Advantageously, the use of components with reduced complexity is made possible. This results in a cost advantage and the usability of a large number of components, for example the connector 120 in the form of an unsealed connector. There is the possibility of omitting difficult and/or expensive production process steps such as, for example, lacquering after soldering or encapsulating. This favors the use of certain production processes, for example SMD construction, aluminum substrate circuit boards, printed circuit boards without the possibility of through-plating, from a safety-relevant point of view. There is the possibility of the detection method being realized in a manner that can be tested, resulting in proof of the safety mechanism over the operating time, which increases safety. In addition, quantifiable proof of protection against unwanted currents is possible. The degree of diagnostic coverage may be in terms of the safety standard or similar.

The protection against the formation of (undetected) current paths between the first contact 252 and the contact 254, as well as the further contacts arranged on the side of the detection electrode 122 opposite to the first contact 252, on the basis of the exemplary embodiment shown in FIG. 2.

According to an exemplary embodiment, the geometry of the arrangement is realized in such a manner that it demonstrably renders possible the detection function. In this case, detection is made possible before the occurrence of an unwanted effect that influences, for example, a sensor signal conducted via at least one of the contacts 252, 254, or within a time frame that enables compliance with the process safety time.

As an alternative to the exemplary embodiment shown in FIG. 2, the connector 120 may be arranged remotely from the printed circuit board 110 instead of on the printed circuit board 110. The third contact 256 in the form of a connector pin may be contacted inside the connector 120 by the detection electrode 122. Alternatively, the connector 120 may have no contacting inside the connector 120, and instead the detection electrode 122 may be contacted outside. As shown in FIG. 2, a third contact 256 may be placed between two or more contacts 252, 254 or voltage-carrying contacts. Alternatively, a plurality of third contacts 256 may be placed between two or more contacts 252, 254 or voltage-carrying contacts. An information channel may run via the contacts 252, 254. Alternatively, the arrangement may be used or extended to detect multiple channels.

The sensor that can be contacted via the connector 120 may be a sensor that can be used in the commercial vehicle sector. Sensory signal channels may be routed via the contacts 252, 254. In particular, a signal output may be routed via at least one of the contacts 252, 254, since the signal output is particularly relevant for safety. This is an essential difference compared to a normal current protection detection or similar.

The detection arrangement (structure/device) 126 is used, according to an exemplary embodiment, to detect that a signal conducted via at least one of the contacts 252, 254 is or would be falsified, which is a so-called "plausible but wrong" signal.

According to an exemplary embodiment, the connector 120 is used to enable contacting of one or more coils in one or more resonant circuits. In this case, such a resonant circuit may have a specific oscillation frequency.

Advantageously, a possibly increased automotive integrity level can be achieved by use of the detection electrode 122. This means, for example, that a specified safety requirement level for safety-relevant systems in motor vehicles can be achieved.

According to different exemplary embodiments, a direct current, an alternating current, high frequency currents greater than currents of the normal 50/60/XXHz power grid, an analog signal current, an operating current and/or an excitation current are/is transmitted via at least one of the contacts 252, 254.

According to an exemplary embodiment, the leakage current is detected within the connector 120.

According to an exemplary embodiment, a sensor system is monitored and supplied with an analog voltage signal. Additionally or alternatively, a high-frequency resonant circuit is protected. The lead-off to the detection arrangement 126 is effected on the printed circuit board 110, which may be a printed circuit board, and not in a cable. The detection electrode 122 is not used to cause a specific change in resistance, but to detect a possible unwanted change in resistance.

According to an exemplary embodiment, the detection electrode 122 does not detect ground but, if necessary, also resistance drops between the contacts 252, 254 whose potential does not correspond to ground. Here, which is particularly advantageous in sensor technology, there is also the possibility of detecting a continuous leakage current and/or resistance reduction profile, not only on the basis of a single threshold value. In the case of a known influence, e.g. a delta (signal value) over resistance, which is measured in the development and stored in a control device or the detection arrangement 126, this can be used for a correction of a signal falsified by the leakage current.

Figure 3:
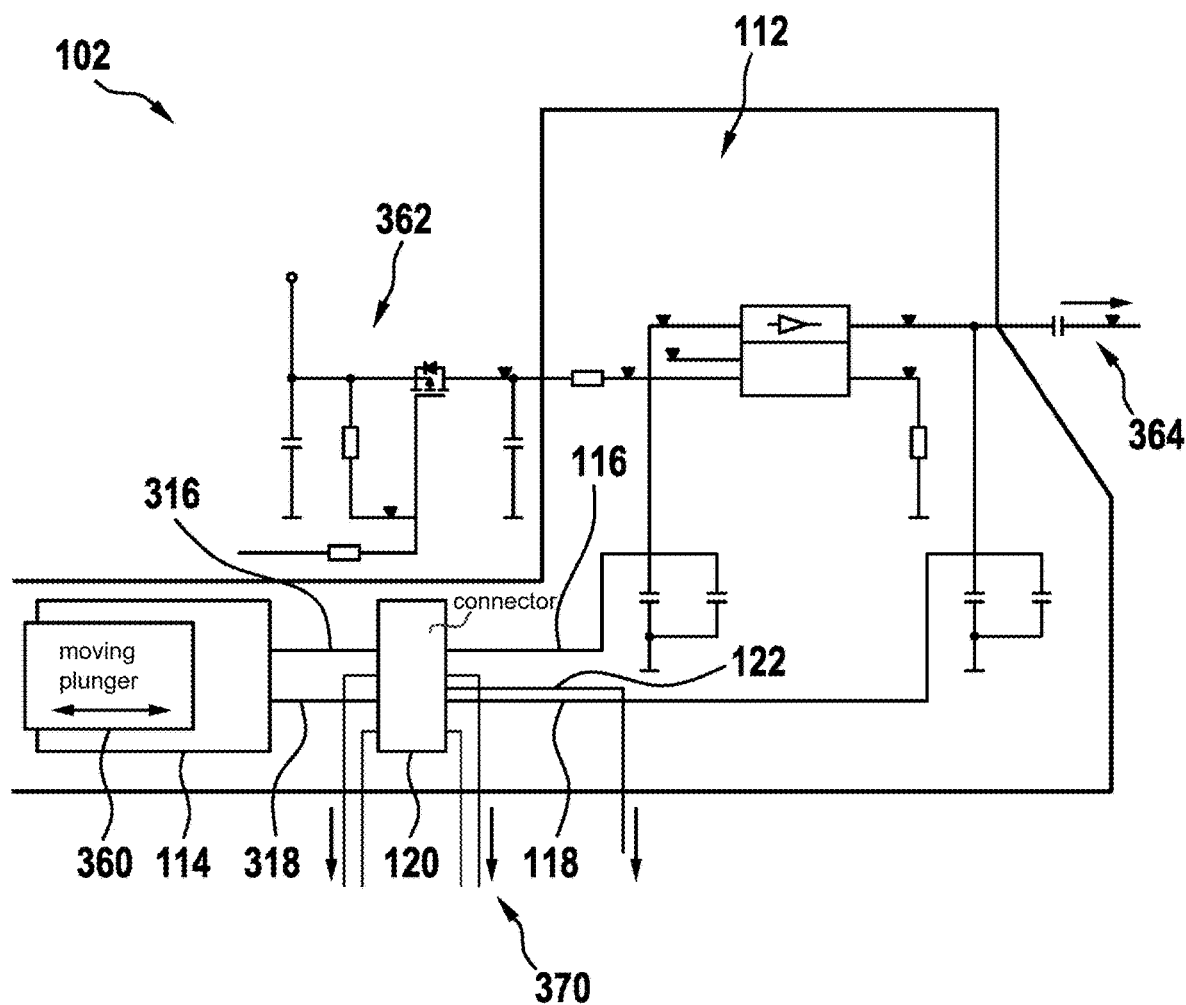
FIG. 3 shows a circuit device according to an exemplary embodiment.

FIG. 3 shows a circuit device 102 according to an exemplary embodiment. This may be an exemplary embodiment of the circuit device described on the basis of FIG. 1.

The one circuit device 102 comprises an operating circuit 112, which is connected via a first conductor track 116 and a second conductor track 118, a connector 120 and a first lead 316 and a second lead 318 to a unit 114, which is realized here as a coil, here a so-called "select coil". The unit 114 is configured to sense a moving target, here in the form of a moving plunger 360. The possible movement of the movable plunger 360 is indicated by a double arrow.

The first conductor track 116 is connected to the first line 316 via a first contact of the connector 120. The second conductor track 118 is connected to the second line 318 via a second contact of the connector 120. Arranged between the first contact and the second contact there is a third contact, which serves as a detection electrode or is connected in an electrically conductive manner to a conductor track realized as a detection electrode 122. According to an exemplary embodiment, the detection electrode 122 is connected to a detection arrangement in the form of a microcontroller. The microcontroller is configured, for example, to detect a lowered resistance.

According to an exemplary embodiment, routed via the connector 120 is a further pair of lines 370 is, which connect a further coil for moving the plunger 360, or a further plunger, to a set of electronics, for example in the form of a further oscillator circuit, for controlling the further coil. In this way, by use of the detection electrode 122, a leakage current affecting the further pair of lines 370 can also be detected.

The operating circuit 112 has a voltage supply arrangement 362 and a data output 364, which serves, for example, as an interface to the microcontroller that comprises the functionality of the detection arrangement or to another microcontroller. A position signal indicating a current position of the plunger 360 may be output, for example, via the data output 364.

The required position or required positions of the detection electrode 122 or a plurality of detection electrode depends on the so-called pinning in the connector 120, and is therefore shown only schematically in FIG. 3.

Figure 4:
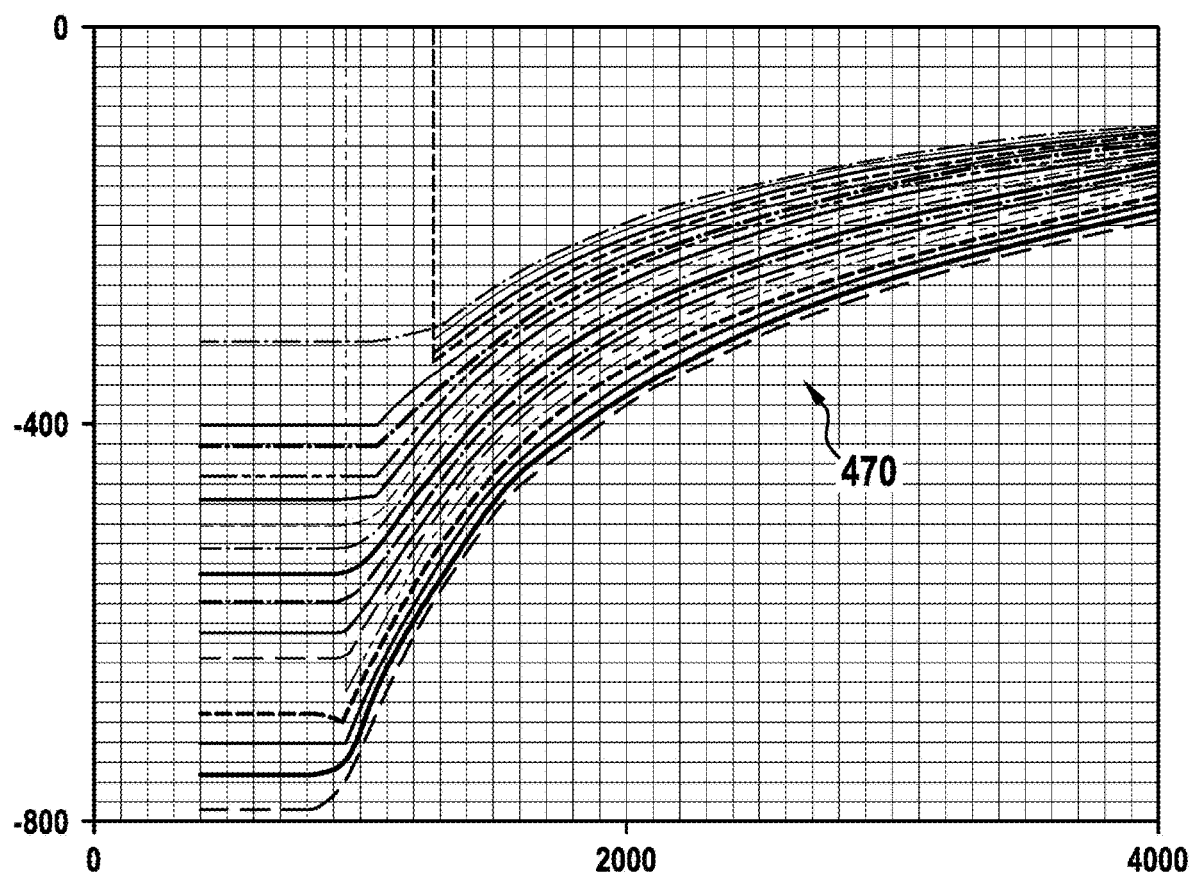
FIG. 4 shows a set of curves according to an exemplary embodiment.

FIG. 4 shows a set of curves 470 that results, according to an exemplary embodiment, from different plunger positions, for example positions of the plunger shown in FIG. 3. The unwanted resistance in ohms is plotted on the abscissa, and the errors count on the ordinate. For example, resistance values between 0 Ohm and 4000 Ohm are plotted on the abscissa and an error count between −800 and 0 is plotted on the ordinate.

The topmost curve of the set of curves 470 is assigned to a plunger position of −1 mm, and the lowermost curve of the set of curves 470 is assigned to a plunger position of 17 mm. The curves in-between are assigned to further plunger positions, each differing by one millimeter.

In cases in which a largely precise characterization of the error influence is not possible, but only a somewhat coarser error frame can be determined by the knowledge of the resistance, the determination may not support the complete compensation of the error, but may support a degradation strategy at system level, for example in which a coarser control is effected as a, possibly temporary, emergency program. This is of particular interest or advantage for functions of highly automated driving.

Possible system reactions, for example as a subsequent step of the evaluation logic, consist of a compensation of the signal value or a defined reaction, such as switching off the sensor, change-over of the system to a safe state, a driver warning, or both, depending on the magnitude of resistance.

Figure 5:
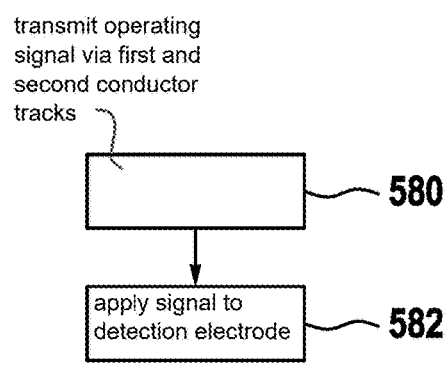
FIG. 5 shows a flowchart of a method for operating a circuit device according to an exemplary embodiment.

FIG. 5 shows a flowchart of a method for operating a circuit device such as described, for example, in the previous figures, according to an exemplary embodiment. In a step 580, an operating signal is transmitted via the first conductor track and the second conductor track, i.e. for example also via the first and second contacts of the connector shown in FIG. 2. In a step 582, the signal applied to the detection electrode is evaluated in order to detect the leakage current. Steps 580, 582, and in particular step 582, may be performed repeatedly, for example in order to be able to continuously monitor the presence of a leakage current and a magnitude of the leakage current.

If an exemplary embodiment comprises an "and/or" link between a first feature and a second feature, this is to be read as meaning that the exemplary embodiment comprises both the first feature and the second feature according to one embodiment, and either only the first feature or only the second feature according to another embodiment.

THE LIST OF REFERENCES IS AS FOLLOWS 100 vehicle
102 circuit device
104 system
110 printed circuit board
112 operating circuit
114 unit
116 first conductor track
118 second conductor track
120 connector
122 detection electrode
124 leakage current
126 detection arrangement
128 third conductor track
130 detection signal
132 position signal
134 correction signal
136 switch-off signal
138 change-over signal
140 warning signal
142 profile signal
250 boundary
252 first contact
254 second contact
256 third contact
316 first line
318 second line
360 plunger
370 pair of lines
470 set of curves
580 step of transmitting
582 step of evaluating

The invention claimed is:
1. A circuit device for a vehicle, comprising:
   a printed circuit board having an operating circuit for operating a unit, a first conductor track for connecting the operating circuit to the unit, and a second conductor track for connecting the operating circuit to the unit;
   a detection electrode for detecting a leakage current affecting at least one of the conductor tracks; and a detection arrangement to use a signal applied to the detection electrode to provide a detection signal representing the leakage current;

wherein the detection arrangement is configured to use the detection signal to provide a correction signal for correcting a signal transmitted via the first conductor track and/or the second conductor track and distorted by the leakage current, wherein the first conductor track is coupled between the first terminal of the operating circuit and the first contact of the connector, and is further coupled between the first contact of the connector and the first terminal of the unit, wherein the second conductor track is coupled between the second terminal of the operating circuit and the second contact of the connector, and is further coupled between the second contact of the connector and the second terminal of the unit, wherein the first conductor track and the second conductor track are arranged in parallel between the operating circuit and the unit, wherein the vehicle has a system, which is a braking system, and wherein the circuit device is part of the system and is installed in the vehicle.

2. The circuit device of claim 1, wherein the detection electrode is arranged to detect the leakage current between the first conductor track and the second conductor track and/or the leakage current between one of the conductor tracks and a further electrical line or electrical potential surface of the printed circuit board.

3. The circuit device of claim 1, wherein the operating circuit is configured to operate a unit, which includes a sensor.

4. The circuit device of claim 1, wherein the operating circuit is configured to read-in, via at least one of the conductor tracks, a data signal provided by the unit.

5. The circuit device of claim 1, wherein the operating circuit is configured to read-in, via at least one of the conductor tracks, an error signal from the unit.

6. A circuit device for a vehicle, comprising:
a printed circuit board having an operating circuit for operating a unit, a first conductor track for connecting the operating circuit to the unit, and a second conductor track for connecting the operating circuit to the unit;
a detection electrode for detecting a leakage current affecting at least one of the conductor tracks; and
a detection arrangement to use a signal applied to the detection electrode to provide a detection signal representing the leakage current;
wherein the operating circuit includes an oscillator circuit to operate the unit, which includes the coil,
wherein the first conductor track is coupled between the first terminal of the operating circuit and the first contact of the connector, and is further coupled between the first contact of the connector and the first terminal of the unit,
wherein the second conductor track is coupled between the second terminal of the operating circuit and the second contact of the connector, and is further coupled between the second contact of the connector and the second terminal of the unit,
wherein the first conductor track and the second conductor track are arranged in parallel between the operating circuit and the unit,
wherein the vehicle has a system, which is a braking system, and
wherein the circuit device is part of the system and is installed in the vehicle.

7. A circuit device for a vehicle, comprising:
a printed circuit board having an operating circuit for operating a unit, a first conductor track for connecting the operating circuit to the unit, and a second conductor track for connecting the operating circuit to the unit;
a detection electrode for detecting a leakage current affecting at least one of the conductor tracks;
a detection arrangement to use a signal applied to the detection electrode to provide a detection signal representing the leakage current; and
a connector for connecting the unit to the printed circuit board;
wherein the connector has a first contact for contacting a first terminal of the unit, a second contact for contacting a second terminal of the unit, and a third contact arranged between the first contact and the second contact,
wherein the first contact is connected to the first conductor track, the second contact is connected to the second conductor track, and the third contact is connected to the detection electrode or is the detection electrode,
wherein the first conductor track is coupled between the first terminal of the operating circuit and the first contact of the connector, and is further coupled between the first contact of the connector and the first terminal of the unit,
wherein the second conductor track is coupled between the second terminal of the operating circuit and the second contact of the connector, and is further coupled between the second contact of the connector and the second terminal of the unit,
wherein the first conductor track and the second conductor track are arranged in parallel between the operating circuit and the unit,
wherein the vehicle has a system, which is a braking system, and
wherein the circuit device is part of the system and is installed in the vehicle,
wherein the circuit device is installed in the vehicle.

8. A circuit device for a vehicle, comprising:
a printed circuit board having an operating circuit for operating a unit, a first conductor track for connecting the operating circuit to the unit, and a second conductor track for connecting the operating circuit to the unit;
a detection electrode for detecting a leakage current affecting at least one of the conductor tracks; and
a detection arrangement to use a signal applied to the detection electrode to provide a detection signal representing the leakage current;
wherein the detection arrangement is configured to use the detection signal to provide a correction signal for correcting a signal transmitted via the first conductor track and/or the second conductor track, a switch-off signal for switching off the unit, a change-over signal for changing over the system having the circuit device to a safe state, or a warning signal,
wherein the first conductor track is coupled between the first terminal of the operating circuit and the first contact of the connector, and is further coupled between the first contact of the connector and the first terminal of the unit,
wherein the second conductor track is coupled between the second terminal of the operating circuit and the second contact of the connector, and is further coupled between the second contact of the connector and the second terminal of the unit, wherein the first conductor track and the second conductor track are arranged in parallel between the operating circuit and the unit, wherein the vehicle has a system, which is a braking system, and wherein the circuit device is part of the system and is installed in the vehicle.

9. A circuit device for a vehicle, comprising:
a printed circuit board having an operating circuit for operating a unit, a first conductor track for connecting the operating circuit to the unit, and a second conductor track for connecting the operating circuit to the unit;
a detection electrode for detecting a leakage current affecting at least one of the conductor tracks; and
a detection arrangement to use a signal applied to the detection electrode to provide a detection signal representing the leakage current;
wherein the detection arrangement is configured to determine a time profile of the signal applied to the detection electrode, and to use the time profile to provide the detection signal,
wherein the first conductor track is coupled between the first terminal of the operating circuit and the first contact of the connector, and is further coupled between the first contact of the connector and the first terminal of the unit,
wherein the second conductor track is coupled between the second terminal of the operating circuit and the second contact of the connector, and is further coupled between the second contact of the connector and the second terminal of the unit,
wherein the first conductor track and the second conductor track are arranged in parallel between the operating circuit and the unit,
wherein the vehicle has a system, which is a braking system, and
wherein the circuit device is part of the system and is installed in the vehicle.

10. The circuit device of claim 1, wherein the detection arrangement is configured to use a signal applied to the detection electrode to determine an electrical resistance value between the first conductor track and the second conductor track, and to use the resistance value to determine the detection signal.

11. A circuit device for a vehicle, comprising:
a printed circuit board having an operating circuit for operating a unit, a first conductor track for connecting the operating circuit to the unit, and a second conductor track for connecting the operating circuit to the unit;
a detection electrode for detecting a leakage current affecting at least one of the conductor tracks;
a detection arrangement to use a signal applied to the detection electrode to provide a detection signal representing the leakage current; and
a movable plunger, wherein the operating circuit is configured to use an operating signal, transmitted via the first conductor track and the second conductor track, to provide a position signal representing a position of the movable plunger;
wherein the first conductor track is coupled between the first terminal of the operating circuit and the first contact of the connector, and is further coupled between the first contact of the connector and the first terminal of the unit,
wherein the second conductor track is coupled between the second terminal of the operating circuit and the second contact of the connector, and is further coupled between the second contact of the connector and the second terminal of the unit,
wherein the first conductor track and the second conductor track are arranged in parallel between the operating circuit and the unit,
wherein the vehicle has a system, which is a braking system, and
wherein the circuit device is part of the system and is installed in the vehicle.

12. A method for operating a circuit device in a vehicle, the method comprising:
transmitting an operating signal via a first conductor track and a second conductor track, wherein the circuit device includes:
a printed circuit board having an operating circuit for operating a unit, the first conductor track for connecting the operating circuit to the unit, and the second conductor track for connecting the operating circuit to the unit;
a detection electrode for detecting a leakage current affecting at least one of the conductor tracks; and
a detection arrangement to use a signal applied to the detection electrode to provide a detection signal representing the leakage current, wherein the detection arrangement is configured to use the detection signal to provide a correction signal for correcting a signal transmitted via the first conductor track and/or the second conductor track and distorted by the leakage current; and
evaluating the signal applied to the detection electrode to detect the leakage current;
wherein the first conductor track is coupled between the first terminal of the operating circuit and the first contact of the connector, and is further coupled between the first contact of the connector and the first terminal of the unit,
wherein the second conductor track is coupled between the second terminal of the operating circuit and the second contact of the connector, and is further coupled between the second contact of the connector and the second terminal of the unit,
wherein the first conductor track and the second conductor track are arranged in parallel between the operating circuit and the unit,
wherein the vehicle has a system, which is a braking system, and
wherein the circuit device is part of the system and is installed in the vehicle.

13. The circuit device of claim 1, wherein the circuit arrangement is in the vehicle, and wherein the unit is part of the circuit device or a part of the system of the vehicle.

14. The circuit device of claim 13, wherein a first terminal of the operating circuit is connected to a first terminal of the unit via the first conductor track, wherein a second terminal of the operating circuit is connected to a second terminal of the unit via the second conductor track.

15. The circuit device of claim 14, wherein the conductor tracks directly connect the operating circuit to the unit, or wherein the printed circuit board has a connector, wherein the first conductor track connects the first terminal of the operating circuit to a first contact of the connector, and the second conductor track connects the second terminal of the operating circuit to a second contact of the connector, wherein the first terminal of the unit is connected to the first contact of the connector via a first line, and the second terminal of the unit is connected to the second contact of the connector via a second line.

16. The circuit device of claim 15, wherein the unit includes at least one of a sensor, an actuator, a coil, and an electrical circuit.

17. The circuit device of claim 1, wherein the first conductor track and the second conductor track are arranged in parallel to one another.

18. The circuit device of claim 6, wherein the first conductor track and the second conductor track are arranged in parallel to one another.

19. The circuit device of claim 7, wherein the first conductor track and the second conductor track are arranged in parallel to one another.

20. The circuit device of claim 8, wherein the first conductor track and the second conductor track are arranged in parallel to one another.

21. The circuit device of claim 9, wherein the first conductor track and the second conductor track are arranged in parallel to one another.

22. The circuit device of claim 11, wherein the first conductor track and the second conductor track are arranged in parallel to one another.

23. The method of claim 12, wherein the first conductor track and the second conductor track are arranged in parallel to one another.

* * * * *